(12) United States Patent
Eschbach et al.

(10) Patent No.: US 8,551,675 B2
(45) Date of Patent: Oct. 8, 2013

(54) MOUNTING A PELLICLE TO A FRAME

(75) Inventors: Florence Eschbach, Portola Valley, CA (US); Paul Zimmerman, Cedar Creek, TX (US); Alexander Tregub, Oak Park, CA (US); Fu-Chang Lo, Palo Alto, CA (US)

(73) Assignee: Intel Corporation, Santa Clara, CA (US)

( * ) Notice: Subject to any disclaimer, the term of this patent is extended or adjusted under 35 U.S.C. 154(b) by 95 days.

(21) Appl. No.: 13/208,300

(22) Filed: Aug. 11, 2011

(65) Prior Publication Data

US 2011/0294048 A1  Dec. 1, 2011

Related U.S. Application Data

(62) Division of application No. 11/957,350, filed on Dec. 14, 2007, now Pat. No. 8,012,651, which is a division of application No. 10/649,355, filed on Aug. 26, 2003, now Pat. No. 7,316,869.

(51) Int. Cl.
*G03F 9/00*   (2006.01)

(52) U.S. Cl.
USPC .............. 430/5; 430/311; 428/14; 428/421; 428/422; 359/350

(58) Field of Classification Search
USPC ........ 430/5, 311; 428/14, 421, 422; 359/350
See application file for complete search history.

(56) References Cited

U.S. PATENT DOCUMENTS

| | | | |
|---|---|---|---|
| 4,060,654 A | 11/1977 | Quenneville | |
| 4,296,151 A | 10/1981 | Boultinghouse | |
| 4,737,387 A * | 4/1988 | Yen | ................ 428/14 |
| 4,743,493 A | 5/1988 | Sioshansi et al. | |
| 5,041,304 A | 8/1991 | Kusano et al. | |
| 5,286,567 A | 2/1994 | Kubota et al. | |
| 5,344,677 A | 9/1994 | Hong | |
| 5,378,514 A | 1/1995 | Hamada et al. | |
| 5,643,654 A | 7/1997 | Fujita et al. | |
| 5,693,382 A | 12/1997 | Hamada et al. | |
| 5,723,860 A | 3/1998 | Hamada et al. | |
| 5,880,204 A | 3/1999 | McCarthy et al. | |

(Continued)

FOREIGN PATENT DOCUMENTS

| EP | 0 252 673 A1 | 1/1988 |
|---|---|---|
| EP | 252673 A2 * | 1/1988 |

(Continued)

OTHER PUBLICATIONS

Cotte et al., "Numerical and Experimental Studies of Pellicle-Induced Photomask Distortions", Proceedings of SPIE, The Int'l Soc. For Optical Engineering, vol. 4562, pp. 641-651(2002).

(Continued)

*Primary Examiner* — Peter D. Mulcahy
*Assistant Examiner* — Henry Hu
(74) *Attorney, Agent, or Firm* — Blakely, Sokoloff, Taylor & Zafman LLP (57) ABSTRACT

A pellicle membrane is mounted between an outer frame and an inner frame. At least one of the frames is attached to the reticle without using conventional adhesives. The pellicle and reticle may be used in a lithography system. The pellicle allows radiation to pass through the pellicle to the reticle and may prevent particles from passing through the pellicle.

5 Claims, 6 Drawing Sheets

(56) References Cited

U.S. PATENT DOCUMENTS

| | | | |
|---|---|---|---|
| 5,958,524 | A | 9/1999 | Dehennau et al. |
| 5,958,631 | A * | 9/1999 | Acosta et al. ............... 430/5 |
| 6,055,040 | A | 4/2000 | Sego |
| 6,083,577 | A | 7/2000 | Nakagawa et al. |
| 6,111,062 | A | 8/2000 | Shirota et al. |
| 6,149,992 | A | 11/2000 | Nakayama |
| 6,300,019 | B1 * | 10/2001 | Ikeda et al. ............... 430/5 |
| 6,436,586 | B1 | 8/2002 | Matsuoka et al. |
| 6,459,491 | B1 | 10/2002 | Nguyen |
| 6,524,754 | B2 | 2/2003 | Eynon |
| 6,548,129 | B2 | 4/2003 | Matsukura et al. |
| 6,639,650 | B2 | 10/2003 | Shirasaki |
| 6,652,958 | B2 | 11/2003 | Tobita |
| 6,822,731 | B1 | 11/2004 | Laganza et al. |
| 6,841,312 | B1 | 1/2005 | Kalk |
| 6,842,227 | B2 | 1/2005 | Shu |
| 6,847,434 | B2 * | 1/2005 | Laganza et al. ............ 355/75 |
| 6,869,733 | B1 | 3/2005 | Su |
| 7,264,853 | B2 * | 9/2007 | Eschbach et al. ............ 428/14 |
| 7,316,869 | B2 * | 1/2008 | Eschbach et al. ............ 430/5 |
| 8,012,651 | B2 * | 9/2011 | Eschbach et al. ............ 430/5 |
| 2001/0004508 | A1 | 6/2001 | Shirasaki |
| 2001/0014375 | A1 | 8/2001 | Tanaka |
| 2001/0024701 | A1 | 9/2001 | Matsukura et al. |
| 2002/0057422 | A1 | 5/2002 | Arakawa |
| 2002/0136965 | A1 | 9/2002 | Tsumoto et al. |
| 2002/0179852 | A1 | 12/2002 | Zheng et al. |
| 2003/0022073 | A1 | 1/2003 | Wang |
| 2003/0096178 | A1 | 5/2003 | Fujita et al. |
| 2003/0123042 | A1 * | 7/2003 | Laganza et al. ............ 355/72 |
| 2003/0187168 | A1 | 10/2003 | Sunaga et al. |
| 2003/0192567 | A1 | 10/2003 | Koizumi et al. |
| 2004/0009425 | A1 | 1/2004 | French et al. |
| 2004/0123950 | A1 | 7/2004 | Boyd |
| 2005/0045262 | A1 * | 3/2005 | Eschbach et al. ............ 156/60 |
| 2005/0202252 | A1 | 9/2005 | Tregub et al. |
| 2005/0203254 | A1 | 9/2005 | Tregub et al. |
| 2007/0037074 | A1 | 2/2007 | Tregub et al. |

FOREIGN PATENT DOCUMENTS

| | | |
|---|---|---|
| EP | 0 416 528 A1 | 3/1991 |
| EP | 0 438 602 | 7/1991 |
| EP | 0 529 827 | 3/1993 |
| EP | 0 942 325 | 9/1999 |
| JP | 09-0059852 | 1/1997 |
| WO | WO 93/24559 | 12/1993 |

OTHER PUBLICATIONS

Allinger, Norman et al., *Organic Chemistry*, Worth Publishers, Inc. 1971, p. 674.

D.W. Van Krevelen, with the collaboration of P.J. Hoftyzer; "Properties of Polymers, Their Estimation and Correlation with Chemical Structure", Second, completely revised edition; 1976, Elsevier Scientific Publishing Company, Amsterdam—Oxford—New York.

Oshima et al., Radiation Physics and Chemistry, "Chemical Structure and Physical Properties of Radiation-Induced Crosslinking of Polytetrafluoroethylene", 2001 Elsevier Science Ltd.; www.elsevier.com/locate/radphyschem.

Reu et al., "Mechanical Analysis of Hard Pellicles for 157 nm Lithography", to appear in the Proceedings of the 2001 SPIE Symposium of Optical Microlithography XIV, vol. 4346, 2001; UW Computational Mechanics Center, University of Wisconsin, Madison, WI 53706; Intel Corporation, Santa Clara, CA 95052.

Kozeki et al., Longevity of 193nm/ArF Excimer Pellicle; Apr. 26, 2001; Mitsui Chemicals, Inc. Pellicles Department.

Shu et al. "Hard Pellicles Study for 157-nm Lithography", Preprint, to appear in the Proceedings of Photomask, Japan 2002.

Chen et al., "Pellicle-Induced Reticle Distortion: An Experimental Investigation", Proc. of SPIE The Int'l Soc. for Optical Engineering. vol. 3546, pp. 167-172 (1998).

Cotte et al., "Effects of Soft Pellicle Frame Curvature and Mounting Process on Pellicle-Induced Distortions in Advanced Photomasks", Proc. of SPIE—The Int'l Soc. For Optical Engineering, vol. 5040, pp. 1044-1054 (2003).

Cotte et al., "Experimental and Numerical Studies of the Effects of Materials and Attachment Conditions on Pellicle-Induced Distortions in Advanced Photomasks", Proc. of SPIE—The Int'l Soc. For Optical Engineering, vol. 4754, pp. 579-588 (2002).

Hawley's Condensed Chemical Dictionary, 13$^{th}$ Edition, Revised by Richard J. Lewis, Sr., John Wiley & Sons, Inc., New York, NY 1997, p. 297.

Karis et al., "Characterization of a Fluorocarbon Film on Magnetic Recording Data", J. Vac. Sci. Technol. A, 15(4):2382-2387, (1997).

Kozeki, T. et al., "Longevity of 193nm/ArF Excimer Pellicle", Mitsui Chemicals, Inc., Pellicle Department, pp. 1-17 (2001).

LaPedus, M., "Nikon Evaluating 157-nm Lithography Options", EE Times UK, http://www.eetuk.com/tech/news/dev/OEG20030523S0061, May 24, 2003.

Oshima et al., "Chemical Structure and Physical Properties of Radiation-Induced Crosslinking of Polytetrafluoroethylene", Radiation Physics and Chemistry, vol. 62, pp. 39-45 (2001).

Resnick & Buck, "Telfon® AF Amorphous Fluoropolymers", Modern Fluoropolymers, Edited by J. Schews, John Wiley & Sons, Inc., pp. 397-419 (1997).

Rue et al., "Mechanical Analysis of Hard Pellicles for 157 nm Lithography", Proc. of the 2001 SPIE Symp. on Optical Microlithography XIV, vol. 4346, 9 pages (2001).

Seki et al., "Electronic Structure of Poly(tetrafluoroethylene) Studied by UPS, VUV Absorption, and Band Calculations", Physica Scripta, 41(1):167-171 (1990).

Shu et al., "Hard Pellicle Study for 157-nm Lithography", Preprint, to appear in the Proceedings of Photomask Japan, pp. 1-12 (2002).

Singer, P., "Atomic Layer Deposition Targets Thin Films", Semiconductor International, 22(10):40 (1999).

Sugiyama, "Perfluoropolymers Obtained by Cyclopolymerization and Their Applications", Modern Fluoropolymers, Edited by J. Schews, John Wiley & Sons, Inc., pp. 541-555 (1997).

Theirich et al., "A Novel Technique for High Rate Plasms Polymerization with Radio Frequency Plasmas", Surface and Coatings Technology, 86-87, pp. 628-633 (1996).

Van Krevelen, D.W., with the collaboration of P.J. Hoftyzer, Properties of Polymers, Their Estimation and Correlation with Chemical Structure, Elsevier Scientific Publishing Company, Amsterdam-Oxford-NewYork, pp. 68-73 (1976).

Walton, K.R., "The Lubrication of Gold Surfaces by Plasma-Deposited Thin Films of Fluorocarbon Polymer", IEE Transactions of Components, Hybrids and Manufacturing Technology, CHMT-3(2);297-304 (1980).

Webster's II New Riverside University Dictionary, Houghton Mifflin Company, 1988, p. 310.

* cited by examiner

MOUNTING A PELLICLE TO A FRAME

This is a Divisional Application of Ser. No. 11/957,350 filed Dec. 14, 2007 now U.S. Pat. No. 8,012,651, issued on Sept. 6, 2011, which is a Divisional Application of Ser. No. 10/649,355, filed Aug. 26, 2003 now U.S. Pat. No. 7,316,869, issued on Jan. 8, 2008.

BACKGROUND

A microchip manufacturing process may form a photosensitive film or photoresist on one or more deposited layers on a wafer. A photolithography system may transmit light through transmissive optics or reflect light from reflective optics to a reticle or patterned mask. Light from the reticle transfers a patterned image onto the photoresist. Portions of the photoresist which are exposed to light may be removed. Portions of the wafer which are not protected by the remaining photoresist may be etched to form transistor features.

A microchip manufacturing process may require several lithography processes to be implemented at the wafer level. The pattern imprinted onto the wafer by the photolithography process at different levels is replicated from the reticle. One reticle may be used to reproducibly imprint thousands of wafers. The reticle may be subjected to handling during its lifetime. There may be a pellicle to protect the reticle from particle contamination deposited onto the pellicalized reticle due to environment and handling.

DETAILED DESCRIPTION

Figure 1:
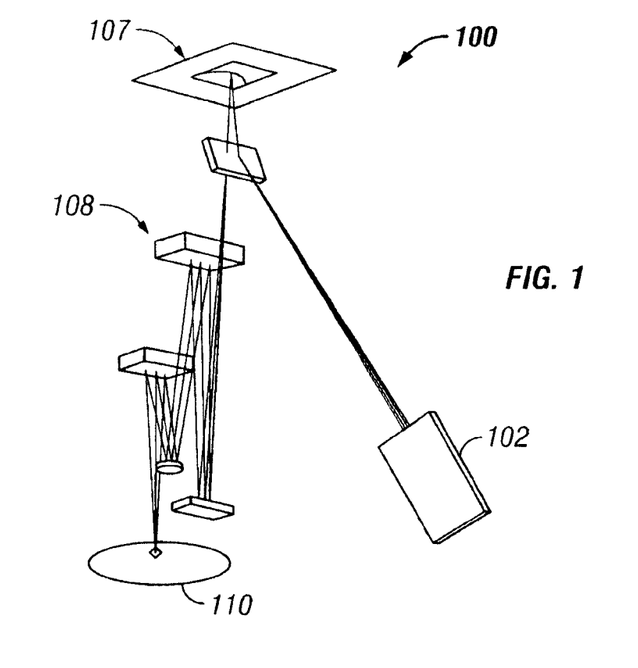
FIG. 1 illustrates an example of a lithography system.

FIG. 1 illustrates an example of a lithography system 100 (also called a lithography tool, a lithographic exposure system, a projection printer, a scanner or a stepper). The lithography system 100 may include a laser or radiation source 102, a reflective reticle 107 with a pattern (also called a mask), and a plurality of reflective reduction optics 108. The reticle 107 may be made of glass and chromium. The laser 102 may produce radiation which reflects off the reticle 107 to form a patterned image on an object 110.

Figure 2A:
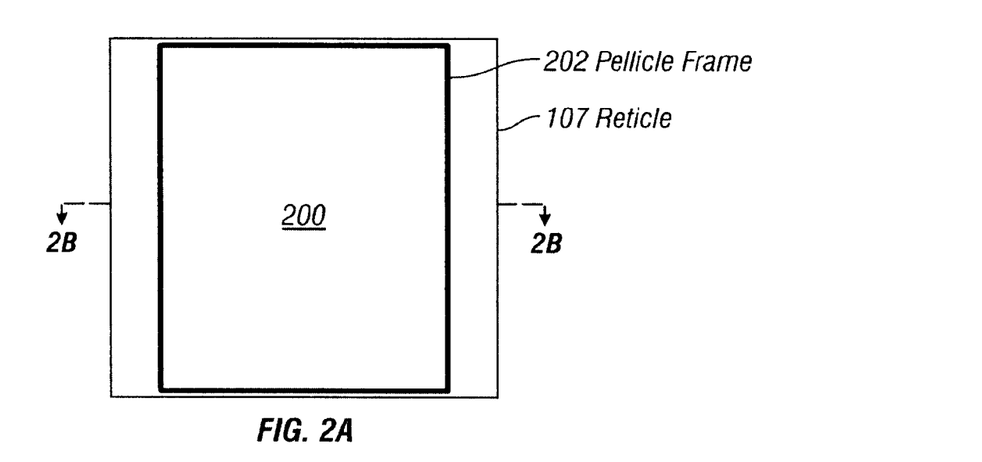
FIGS. 2A and 2B are top and side views, respectively, of a reticle, a pellicle and a pellicle frame, which may be used in the lithography system of FIG. 1.
Figure 2B:
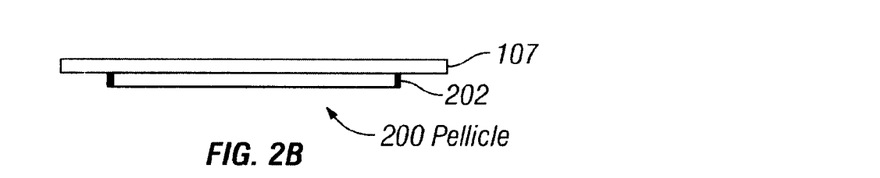

FIGS. 2A and 2B are top and side views, respectively, of the reticle 107 of FIG. 1, a pellicle 200 and a pellicle frame 202, which may be used in the lithography system 100 of FIG. 1. The pellicle 200 may be a thin, transparent membrane which allows radiation from the laser 102 to pass through to the reticle 107. The pellicle 200 and frame 202 may be permanently attached to the reticle 107. The pellicle 200 may be held at a fixed distance from the reticle surface. During the lithography process, the image of most particles on the pellicle 200 may be out of focus on the object (wafer) surface and therefore will not generate a defect on the object 110. The original quality of the reticle 107 may therefore be preserved.

Once the pellicle 200 and frame 202 are properly attached, the surface of the reticle 107 may stay free from future particle contamination. A particle or contamination deposited on the reticle 107 may reduce the yield for an object 110 processed by the lithography system 100. The pellicle 200 and frame 202 are intended to protect (e.g., seal off) the reticle 107 from particles falling onto the reticle due to handling the reticle 107. The pellicle 200 may increase the wafer yield of the lithography system 100.

The pellicle 200 may be applied, stretched and attached to the frame 202 with organic adhesives. The adhesives may typically include low molecular weight compounds, e.g., polymers, with additives or solvents, such as perfluorinated amine solvent. Adhesives may also be used to attach the pellicle frame 202 to the reticle 107. Pressure sensitive gaskets may be used as reticle-to-frame adhesives.

When the pellicle 200 is exposed to radiation (e.g., scattered light or laser exposure) in the lithography system 100 of FIG. 1, the adhesives and solvents may outgas or evaporate. Adhesive or solvent outgasing may produce one or more types of residual organic vapors, which may include compounds such as perfluorotripropylamine. The outgased organic vapors may harm the pellicle 200 by reducing pellicle transparency, cause pellicle thinning and accelerate pellicle photodegradation. As organic vapor concentrations increase, an amount of energy needed to cause a transmission loss in the pellicle 200 may decrease. Thus, outgased organic vapors may reduce a pellicle's lifetime. Thinning of the pellicle 200 may cause defects or particle contamination on the reticle 107.

Figure 3:
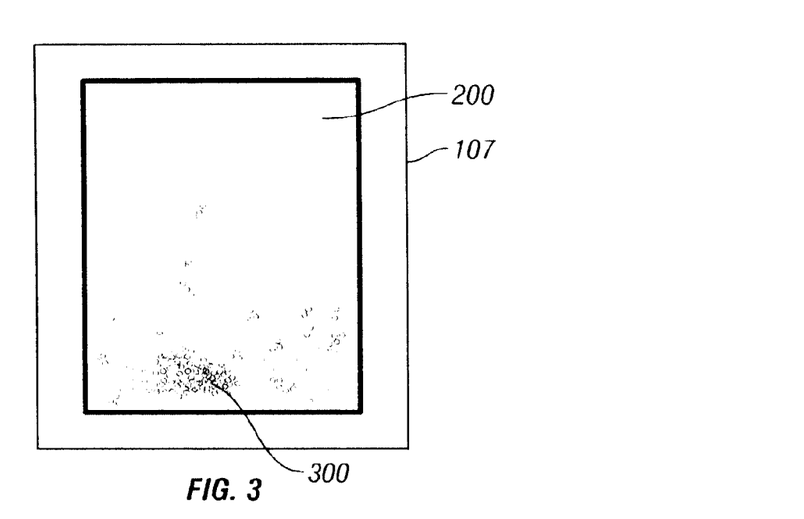
FIG. 3 illustrates defects on the reticle of FIG. 2A after the pellicle and reticle are exposed to radiation in the lithography system of FIG. 1.

FIG. 3 illustrates defects 300 on the reticle 107 of FIG. 2A generated after the pellicle 200 and reticle 107 are exposed to radiation (e.g., several joules) in the lithography system 100 of FIG. 1. The defects 300 may be caused by outgasing of pellicle adhesives and particle contamination at 248-nm, 193-nm, 157-nm or other wavelength radiation. The defects 300 may further degrade the reticle surface if the pellicle 200 is removed and the reticle 107 is cleaned.

The present application relates to mounting a pellicle to outer and inner frames and attaching at least one of the frames to a reticle without using conventional adhesives. Mounting techniques described below may reduce defects caused by outgasing and may avoid cleaning processes.

Figure 4A:
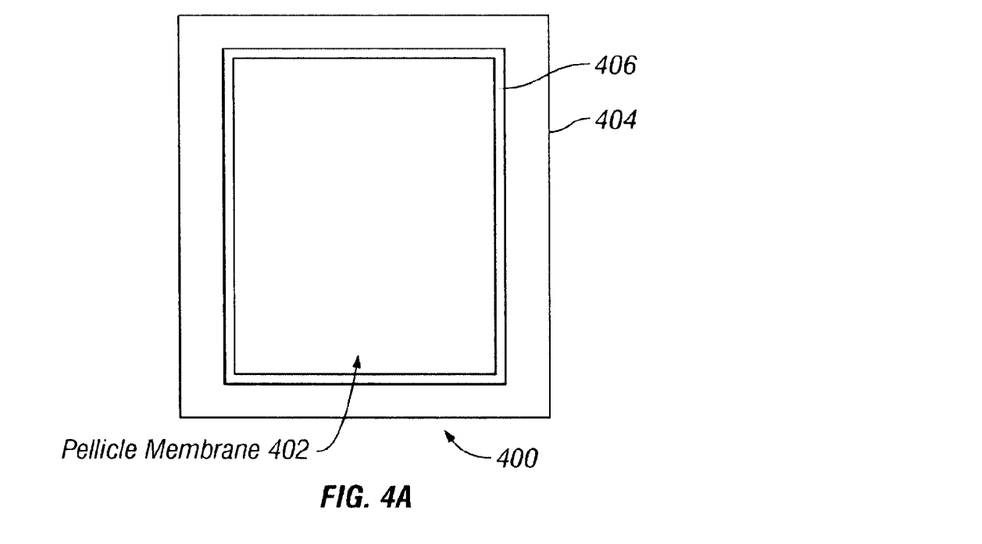
FIGS. 4A and 4B are a top view and a cross-sectional side view, respectively, of a pellicle, an outer pellicle frame and an inner pellicle frame in accordance with an embodiment.
Figure 4B:
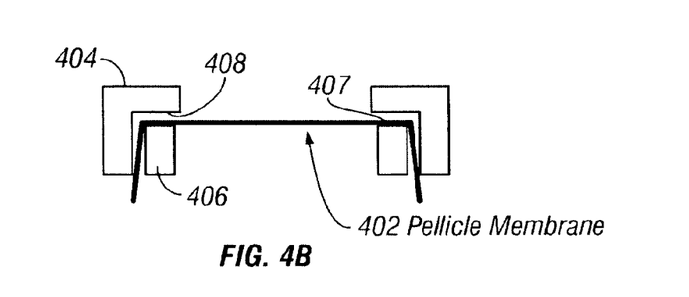

FIGS. 4A and 4B are a top view and a cross-sectional side view, respectively, of a pellicle 402, an outer pellicle frame 404 and an inner pellicle frame 406 in accordance with an embodiment. The pellicle 402 may be optically transparent to a pre-determined exposure wavelength, such as 157 nm, 193 nm, 248 nm or other wavelengths, for example. The pellicle 402 may be a thin polymer membrane, e.g., less than or equal to 10 microns thick, such as 6 microns thick or one micron thick. The pellicle 402 may be a thin film formed by spin coating, extruding, casting or some other method. The pellicle 402 may be any thermoplastic polymer (such as a fluoro polymer, a hydrocarbon polymer, such as cellulose, or a silicon-containing polymer) or copolymers of the above polymers, which may meet desired optical transparency and irradiation durability specifications. An example of a specification for optical transparency may be transmission greater than 90% at an exposure wavelength of 157 nm, 193 nm, 248 nm or any other wavelength. An example of a specification for optical durability may be transmission greater than 90% after several kilojoules/cm$^2$ irradiation equivalent dose at an exposure wavelength of 157 nm, 193 nm, 248 nm or any other wavelength.

As an example, the pellicle 402 may be "Cytop" (amorphous cyclized perfluoropolymer or poly(perfluoro(3-butenyl vinyl ether))), available from Asahi Glass Company in Japan, or "Teflon AF," an amorphous cyclized perfluoropolymer that contains a dioxole ring and a liner fluorocarbon chain, available from DuPont Photomask, Inc., or other polymers meeting optical and durability requirements. These polymers may be used for the pellicle 402 of FIGS. 4A-4B. To provide a conceptual proof of some aspects of the present application, a sheet of 6-micron thick of a thermoplastic polymer polytetrafluoroethylene (PTFE) film, such as a DF100 C cast film obtained from St. Gobain of Garden Grove, Calif., was used. PTFE is a polymer comprised of a —CF2-CF2— repeat monomer unit.

The dual frames 404, 406 in FIGS. 4A-4B may be made of metals, such as aluminum or invar (metal alloy containing iron (Fe), nickel (Ni) and cobalt (Co)). The outer pellicle frame 404 may be made of the same material or a different material as the inner frame 406. The frames 404, 406 may have various application-dependent forms. As an example, the frames 404, 406 may have a size of 148×122×6.3 mm or 148×105×5.0 mm. Another possible length×width dimension may be 144 mm×120. Other possible pellicle dimensions may based at least in part by values from a lithography stepper equipment manufacturer.

Mechanical Attachment of Pellicle to Frames

In an embodiment, the pellicle 402 may be securely attached or clamped between the outer frame 404 and the inner frame 406 mechanically without using an adhesive, as shown in FIG. 4B. The outer and inner frames 404, 406 may be sized and shaped to connect together by, for example, a snap action or a lock action. A top surface 407 of the inner frame 406 presses against an inner surface 408 of the outer frame 404 with the pellicle 402 held between these surfaces 407, 408. The pellicle 402 may be held by friction. This forms a mechanical attachment of the pellicle 402 to the frames 404, 406, which may avoid using an adhesive and may reduce the chance of outgasing.

Figure 5A:
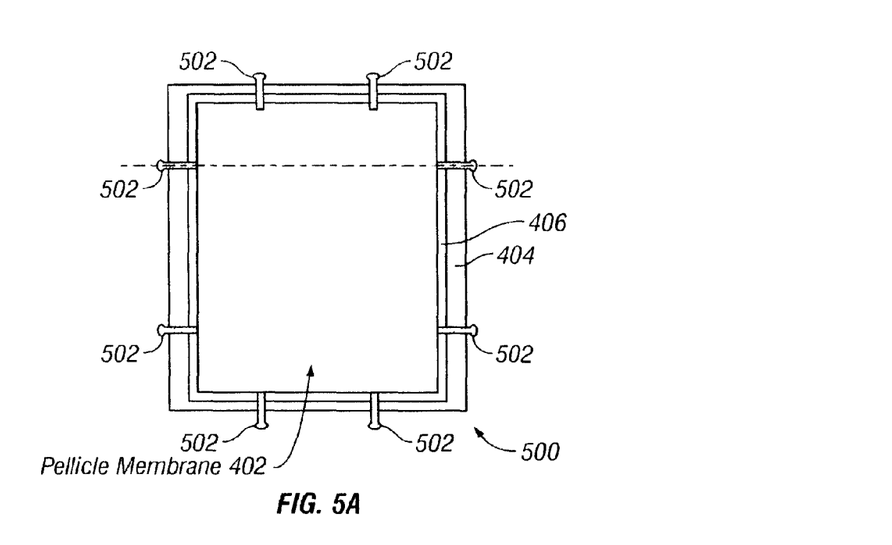
FIGS. 5A and 5B are a top view and a cross-sectional side view, respectively, of the pellicle, outer pellicle frame, and inner pellicle frame of FIG. 4A with optional screws.
Figure 5B:
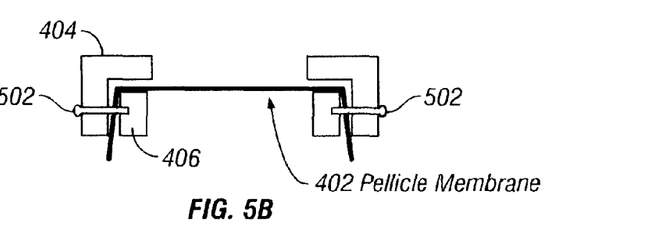

An alternative embodiment is shown in FIGS. 5A and 5B, which show a top view and a cross-sectional side view, respectively, of the pellicle 402, outer pellicle frame 404, and inner pellicle frame 406 of FIG. 4A with screws 502. The screws 502 may attach the outer frame 404 to the inner frame 406. The screws 502 may also hold the pellicle 402 between the frames 404, 406. The screws 502 may extend in substantially the same direction as the pellicle 402, as shown in FIG. 5B.

Heat Treatment of Pellicle

Mechanical attachment and clamping of the pellicle 402 to the outer and inner frames 404, 406 may be combined with, or be replaced by a heat treatment (also called a thermal treatment, which includes a heating and a cooling cycles, to hold and stretch the pellicle 402. Pellicle attachment to the frame is achieved due to thermal expansion of the inner metal frame, which should be greater than both thermal expansions of polymer membrane and outer metal frame.

Figure 6A:
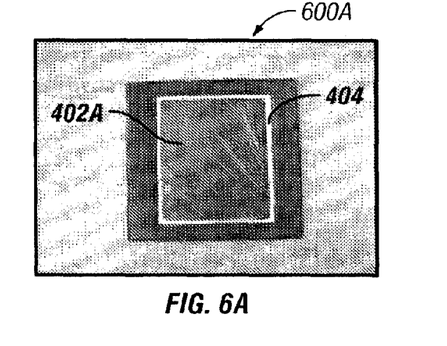
FIGS. 6A and 6B illustrate the pellicle and outer frame of FIG. 4A before a heat treatment and after heat treatment.
Figure 6B:
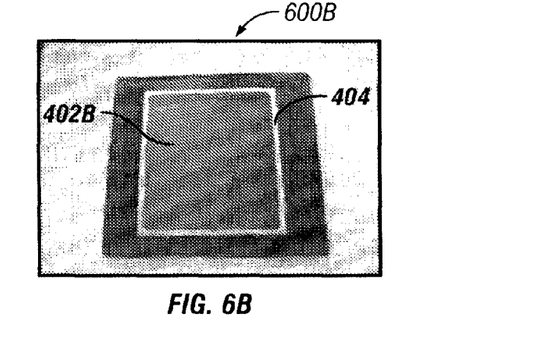

FIGS. 6A and 6B illustrate the pellicle 402 and outer frame 404 of FIG. 4A before a heat treatment 600A and after the heat treatment 600B. The pellicle 402 may be slightly wrinkled (FIG. 6A) after being clamped between the frames 404, 406 and before a heat treatment. The heat treatment may remove wrinkles in the pellicle 402 (FIG. 6A) and stretch the pellicle 402 (FIG. 6B) between the frames 404, 406 (FIGS. 4A-4B). The heat treatment may be in a temperature range above the glass transition temperature of the pellicle 402 (e.g., polymer) and below its melting temperature. The heat treatment may involve inserting the frames 404, 406 and pellicle 402 in an oven.

Selection of materials for the inner and outer frames 406, 404 may be important because a differential in thermal expansion coefficients of the pellicle 402, inner frame 406 and outer frame 404 may affect tension on the pellicle 402. The outer frame 404 may be selected to have a lower coefficient of thermal expansion than the inner frame 406. In another embodiment, the outer and inner frames 404, 406 may both have the same coefficient of thermal expansion. In the latter embodiment, thermal cycling may be combined with mechanical attachment.

As an example, the pellicle 402 and frames 404, 406 may be heated at a rate of 3 degrees Celsius per minute to a holding temperature, such as 200, 329 or 337 degrees Celsius. The holding temperature may be selected above a glass transition temperature (e.g., 131.7 degrees C. in FIG. 10) of the pellicle 402 and up to a melting point temperature of the pellicle 402. For example, the melting point of PTFE film may be about 329 or 340 degrees Celsius, where 329 degrees Celsius may be an onset melting temperature. The pellicle 402 and mounted frames 404, 406 may be held at the selected holding temperature (e.g., 200, 329 or 337 degrees C.) for an hour or other selectable duration.

Figure 10:
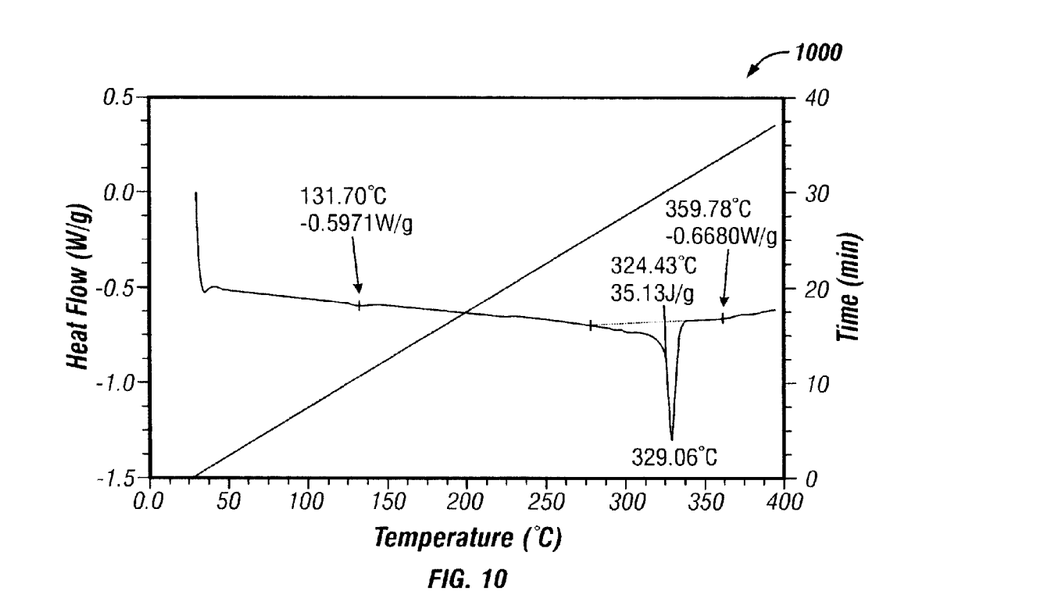
FIG. 10 is a differential scanning calorimetry (DSC) graph of Polytetrafluoroethylene (PTFE), which may be used for the pellicle of FIG. 4A.

FIG. 10 is a differential scanning calorimetry (DSC) graph 1000 of polytetrafluoroethylene (PTFE), which may be used for the pellicle 402 of FIG. 4A. The heat flow (left vertical) axis in FIG. 10 represents heat absorption or heat production in Watts per gram (W/g). The diagonal line in FIG. 10 corresponds to values on the right axis, which represents time in minutes. The bottom (horizontal) axis represents temperature in degrees Celsius. At about 324.43 degrees Celsius, an energy of PTFE may be about 35.13 Joules/gram. FIG. 10 shows a glass transition temperature, a melting point temperature and a range in between the glass transition temperature and melting point temperature.

After the heat treatment, the frames 404, 406 and pellicle 402 may be cooled slowly to room temperature, e.g., at a rate of 4 degrees Celsius per minute. During the heat treatment and cooling, the pellicle 402 (e.g., polymer) clamped between the two frames 404, 406 (e.g., aluminum) may stretch onto the frames 404, 406, as shown in FIG. 6B. The mechanical stretching of the pellicle 402 upon cooling may be attributed to a differential in thermal expansion coefficients of the pellicle 402 (e.g., 8 parts per million (ppm)/degrees Celsius for PTFE) and the frames 404, 406 (e.g., 23.6 ppm/degrees Celsius for aluminum).

Using an inner frame 406 of greater thermal expansion coefficient than the outer frame 404 may be preferred to provide clamping of the pellicle 402 during thermal treatment. The clamping-stretching effect may be more pronounced if the outer frame 404 comprised a material with a lower thermal expansion coefficient than the inner frame 406.

For example, the outer frame 404 may be made of invar with a thermal expansion coefficient of 0 (zero) ppm/degrees Celsius, and the inner frame 406 may be made of aluminum with a thermal expansion coefficient of 23.6 ppm/degrees Celsius. The inner frame 406 may expand less or more than the outer frame 404.

Mechanical attachment of the pellicle 402 to the frames 404, 406 (FIGS. 4A-4B) and a subsequent heat treatment (FIGS. 6A-6B) may maintain tension on the pellicle 402. The heat treatment may be a repeatable process to remove wrinkles in the pellicle 402. The heat treatment may be repeated to remove wrinkles on the thin pellicle film membrane 402 even after the pellicle frame 404 and/or 406 is attached to the reticle 702 (FIG. 7).

Attaching at Least One Frame to a Reticle

Figure 7:
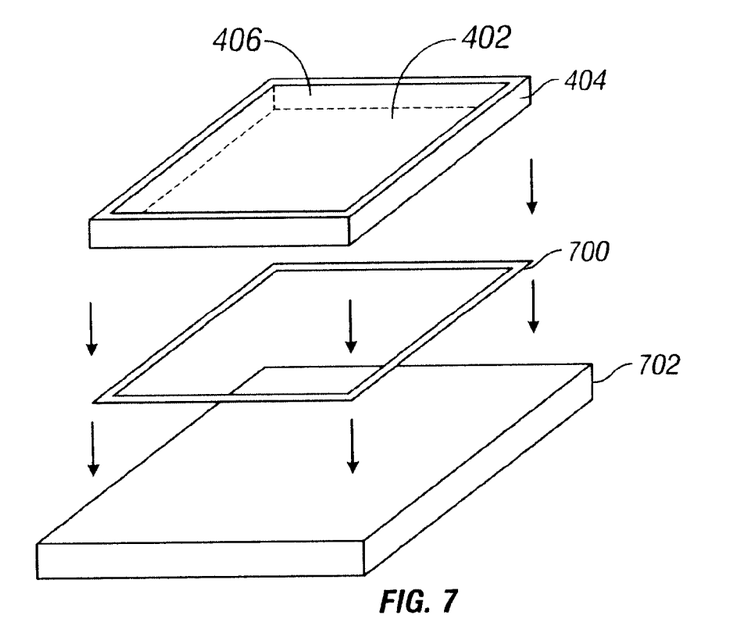
FIG. 7 illustrates the pellicle and pellicle frames of FIG. 4A, a pre-cut polymer layer and a reticle.

FIG. 7 illustrates the pellicle 402 and pellicle frames 404, 406 of FIG. 4A, a pre-cut polymer layer 700 and a reticle 702. The reticle 702 may be made of fused silica and have a coefficient of thermal expansion of 0.55 ppm/degrees Celsius. The outer frame 404 and/or the inner frame 406 may be attached to the reticle 702 by using the polymer layer 700 as an adhesive.

The polymer layer 700 may be a "low melting point polymer" having a melting point between about 60 to 150 degrees Celsius. The "low melting point polymer" may also be called a low melting point, low outgas thermoplastic. For example, the polymer layer 700 may be a polyester thermoplastic obtained from 3M. Thermoplastic materials may be elastic. Typically, thermoplastic materials may have less residual impurities and solvents than other low molecular weight adhesive materials.

The polymer layer 700 may be pre-cut to match a size and shape of a bottom surface area of the inner frame 406 and/or outer frame 404, as shown in FIG. 7. The frames 404, 406 are laid over the pre-cut polymer layer 700. The frames 404, 406, polymer layer 700 and reticle 702 may be aligned by a mounter. Heat and pressure may be applied to the frames 404, 406, polymer layer 700 and reticle 702 to achieve a hermetic seal or bond between the inner and/or outer frames 406, 404 and the reticle 702. The heat and pressure may remove any air gaps between the frames 404, 406, polymer layer 700 and reticle 702. The heat treatment may involve a temperature change from about 45 degrees to 150 degrees Celsius. The polymer layer 700 may be a polyester thermoplastic used with a 65-75 C degree bond line temperature, a 2-second dwell time and 50 pounds per square inch (psi) pressure.

In an embodiment, only the inner frame 406 is attached to the reticle 702 with the polymer layer 700, which leaves the outer frame 404 free to absorb stress or displacement.

A thermoplastic seal between the frame 404 and reticle 702 may be reversibly removed by heating the pellicle 402, frames 404, 406 and reticle 702.

A thermoplastic seal may provide comparable or better particle protection properties than pressure sensitive gaskets, which are currently used as frame-to-reticle adhesives. The polymer layer 700 may have lower residual impurities and solvents than pressure sensitive gaskets. The polymer layer 700 may reduce a chance of outgasing and reduce pellicle deterioration.

Effects of Heating

Figure 8A:
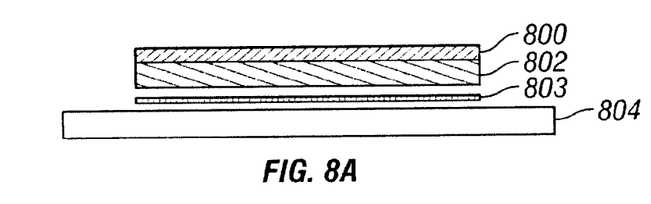
FIGS. 8A-8C are side views of a pellicle, a pellicle frame, an adhesive layer and a reticle being mounted and experiencing a temperature change.
Figure 8B:
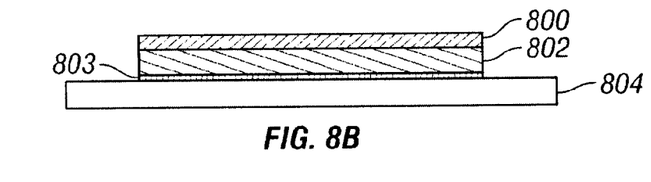
Figure 8C:
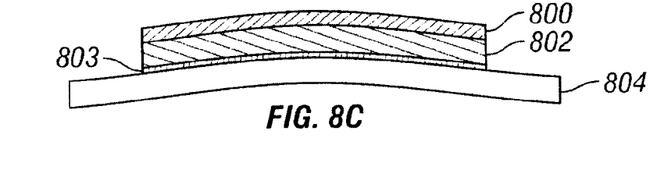

FIGS. 8A-8C are side views of a pellicle 800, a pellicle frame 802, an adhesive layer 803 and a reticle 804. The pellicle 800, pellicle frame 802, adhesive layer 803 and reticle 804 in FIGS. 8A-8C may represent the pellicle 402, outer pellicle frame 404, polymer layer 700 and reticle 702 of FIG. 7 if a "non-localized" heat treatment is used to attach at least one of the frames 404, 406 to the reticle 702. "Non-localized" means heat is applied to all components of FIGS. 8A-8C. "Localized" means heat is only applied to one or more specific components in FIG. 8A.

FIG. 8A illustrates the pellicle 800, pellicle frame 802 and adhesive layer 803, which are flat and unattached to the reticle 804 at an initial temperature of T.

FIG. 8B illustrates the pellicle 800, pellicle frame 802, adhesive layer 803 and reticle 804 of FIG. 8A moved to a location with a temperature of T+ΔT for bonding with a "non-localized" heat treatment. Heat and pressure are applied to bond the pellicle frame 802 to the reticle 804 using the adhesive layer 803.

FIG. 8C illustrates the pellicle 800, pellicle frame 802, adhesive 803 and attached reticle 804 being moved back to a location at temperature T. The non-localized temperature change during adhesive-to-reticle bonding may cause an in-plane distortion of the pellicle frame 802 and reticle 804. For example, a distortion in the reticle 804 may cause a distortion in the pellicle frame 802. FIG. 8C may show an exaggerated amount of distortion because the actual distortion could not be easily seen in the real scale of FIG. 8C. The in-plane distortion in FIG. 8C may occur from a thermal gradient ΔT between a mounting temperature and a stepper use temperature. FIGS. 8A-8C may represent a worst-case scenario where both the reticle 804 and pellicle frame 802 are brought to the set temperature T+ΔT and back to the original temperature T.

If a low melting point polymer layer 700 (FIG. 7) is used as an adhesive to bond at least one of the frames 404, 406 to the reticle 702, a good seal may be obtained by "locally" heating the polymer layer 700. For example, an infrared gun may be used to locally heat the polymer layer 700. Local heating of the polymer layer 700 may cause less distortion than applying heat to the pellicle frames 404, 406 and the reticle 702 (FIG. 8C).

Figure 9:
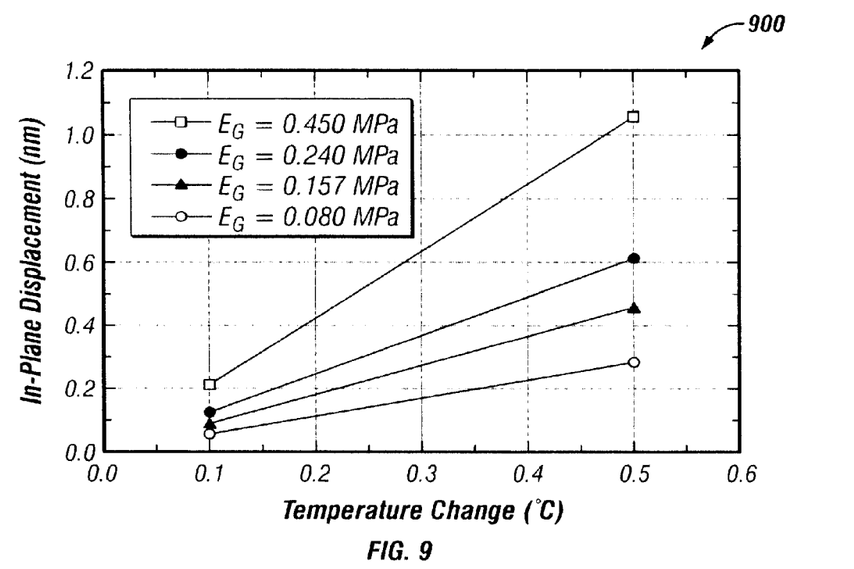
FIG. 9 illustrates a temperature change of reticles and corresponding in-plane displacement or distortion.

FIG. 9 illustrates a temperature change (horizontal axis) of reticles and corresponding in-plane displacement or distortion (vertical axis). The reticles in FIG. 9 have various Young's modulus values (EG). FIG. 9 shows that distortion may be greater for reticles with higher Young's modulus values. Distortion may increase linearly with temperature. Although FIG. 9 shows a temperature change of 0.5 degrees Celsius, FIG. 9 may be used to predict distortion caused by a larger temperature change ΔT in bonding at least one of the frames 404, 406 to the reticle 702 with the polymer layer 700 in FIG. 7. For example, the bonding temperature change may be from 45 degrees to 120 degrees Celsius. In another embodiment, the bonding temperature change may be from 65 degrees to 150 degrees Celsius. The overall magnitude of thermal induced distortion may be low since three out of four plots in FIG. 9 show less than 1 nm displacement for a 0.5 C degree gradient.

Figure 11:
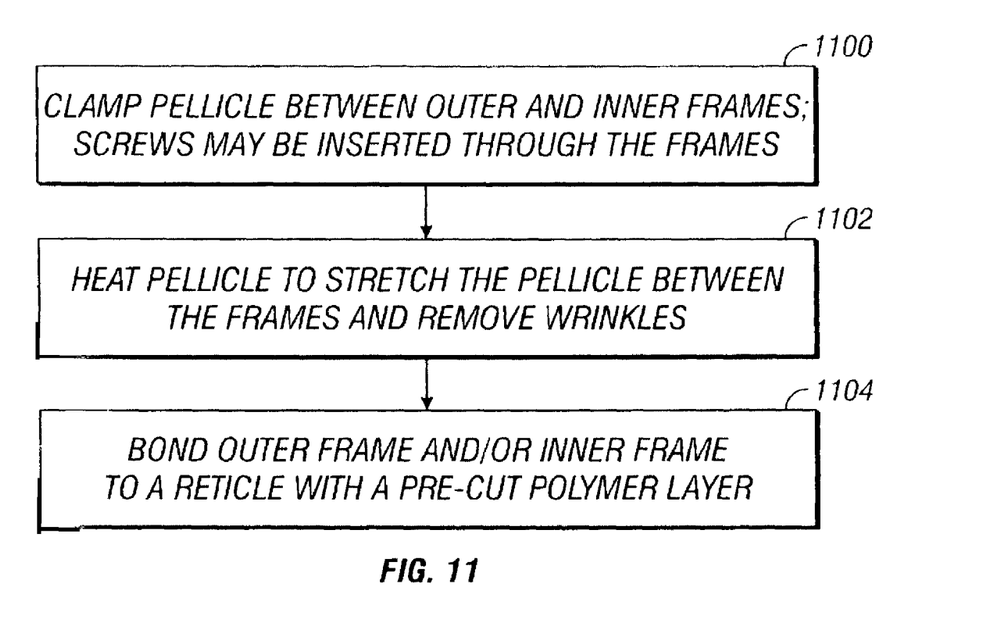
FIG. 11 illustrates a technique of attaching the pellicle to the frames of FIGS. 4A-4B and attaching at least one of the frames to the reticle of FIG. 7.

FIG. 11 illustrates a technique of attaching the pellicle 402 to the frames 404, 406 of FIGS. 4A-4B and attaching at least one of the frames 404, 406 to the reticle 702 of FIG. 6. The pellicle 402 of FIG. 4B is clamped between outer and inner frames 404, 406 at 1100. Screws 502 (FIGS. 5A-5B) may be inserted through the frames 404, 406. The pellicle 402 may be heated to stretch the pellicle 402 and remove wrinkles (FIGS. 6A-6B) at 1102. The outer frame 404 and/or the inner frame 406 may be bonded to a reticle 702 with a pre-cut polymer layer 700 (FIG. 7) at 1104.

The mechanical and thermal techniques, described above for attaching the pellicle 402, frames 404, 406 and reticle 702 without using conventional adhesives, may reduce a potential for adhesive by-product outgasing and improve radiation durability (i.e., lifetime) of a "soft" polymer-based pellicle 402 for 193-nm and 157-nm lithography.

A number of embodiments have been described. Nevertheless, it will be understood that various modifications may be made without departing from the spirit and scope of the application. The techniques described above may be used for other applications besides making pellicles. For example, other applications may use a method comprising: clamping a polymer film between a first frame and a second frame, the polymer film having a different coefficient of thermal expansion than the first and second frames; heating the polymer film in a range between a glass transition temperature and a melting temperature; and cooling the polymer film after heating to stretch the polymer film.

Accordingly, other embodiments are within the scope of the following claim.

What is claimed is:

1. A system comprising:
   a reticle having a pattern for lithographic patterning formed thereon; a flexible pellicle membrane; and
   a pellicle frame comprising an inner frame member and an outer frame member to mechanically clamp the flexible pellicle membrane therebetween and stretch the flexible pellicle membrane spanned across the pellicle frame.

2. The system of claim 1, further comprising a thermoplastic polymer to couple the inner frame member of the pellicle frame to the reticle with the flexible pellicle membrane covering the pattern on the reticle.

3. The system of claim 1, wherein the outer frame member remains unattached to the reticle.

4. The system of claim 1, further comprising a polyester attaching the pellicle frame to the reticle without using an adhesive and with the pellicle membrane covering the pattern on the reticle.

5. The system of claim 1, wherein the inner frame member and the outer frame member are sized and shaped to clamp together by a friction fit.

* * * * *